(12) United States Patent
Sasaoka et al.

(10) Patent No.: US 12,719,442 B2
(45) Date of Patent: Aug. 25, 2026

(54) ACOUSTIC WAVE DEVICE AND MODULE INCLUDING THE SAME

(71) Applicant: Sanan Japan Technology Corporation, Tokyo (JP)

(72) Inventors: Kohei Sasaoka, Koto City (JP); Shinichi Shioi, Tokyo (JP)

(73) Assignee: SANAN JAPAN TECHNOLOGY CORPORATION, Tokyo (JP)

( * ) Notice: Subject to any disclaimer, the term of this patent is extended or adjusted under 35 U.S.C. 154(b) by 679 days.

(21) Appl. No.: 18/339,411

(22) Filed: Jun. 22, 2023

(65) Prior Publication Data

US 2023/0421127 A1 Dec. 28, 2023

(30) Foreign Application Priority Data

Jun. 23, 2022 (JP) ................................ 2022-101461

(51) Int. Cl.
*H03H 9/02* (2006.01)
*H03H 3/10* (2006.01)

(52) U.S. Cl.
CPC .......... *H03H 9/02574* (2013.01); *H03H 3/10* (2013.01); *H03H 9/02661* (2013.01)

(58) Field of Classification Search
CPC ........... H03H 9/02574; H03H 9/02661; H03H 9/14591; H03H 9/6483; H03H 9/02543; H03H 9/02598; H03H 9/02606; H03H 9/02834
See application file for complete search history.

(56) References Cited

U.S. PATENT DOCUMENTS 6,909,338 B2 * 6/2005 Omote .................. H03H 9/605 333/195
7,868,715 B2 * 1/2011 Ito .......................... H03H 9/725 333/195
8,279,021 B2 * 10/2012 Hara ...................... H03H 9/605 333/133
9,985,606 B2 * 5/2018 Miyamoto ............. H03H 9/605
9,998,092 B2 * 6/2018 Taniguchi .......... H03H 9/14538
10,090,823 B2 * 10/2018 Kuzushita ................ H03H 9/13
(Continued)

FOREIGN PATENT DOCUMENTS

JP 2017220778 A * 12/2017 ........... H03H 9/0552
JP 2018067874 A * 4/2018 ........... H03H 9/6483
JP 6656135 B2 * 3/2020 ......... H03H 9/02559

*Primary Examiner* — Pedro J Cuevas
(74) *Attorney, Agent, or Firm* — MUNCY, GEISSLER, OLDS & LOWE, P.C.

(57) ABSTRACT

An acoustic wave device includes series resonators and parallel resonators formed on a main surface of a piezoelectric layer. The series resonators includes a first series resonator including first, second and third series-divided resonators and a second series resonator including fourth, fifth and sixth series-divided resonators. One of the first, second and third series-divided resonators which is disposed at a position where an electric signal is input first, has a first anti-resonance frequency. The others of the first, second and third series-divided resonators have a second anti-resonance frequency. One of the fourth, fifth and sixth series-divided resonators which is centrally disposed has the second anti-resonance frequency, the others of the fourth, fifth, and sixth series-divided resonators have the first anti-resonance frequency.

20 Claims, 5 Drawing Sheets

(56) References Cited

U.S. PATENT DOCUMENTS 10,250,231 B2 * 4/2019 Sakurai .................. H10N 30/87
10,396,759 B2 * 8/2019 Irieda .................... H03H 9/564
10,447,239 B2 * 10/2019 Takahashi .......... H03H 9/02992
10,530,335 B2 * 1/2020 Nosaka .................. H03H 9/568
10,630,261 B2 * 4/2020 Nosaka ................ H03H 9/6403
10,812,048 B2 * 10/2020 Nosaka ................ H03H 9/6483
10,826,460 B2 * 11/2020 Itou ........................ H03H 9/605
10,848,122 B2 * 11/2020 Kaneko ................ H03H 9/6483
10,911,019 B2 * 2/2021 Isaka ...................... H03H 9/605
11,012,048 B2 * 5/2021 Numata ................. H03H 9/145
11,082,031 B2 * 8/2021 Nosaka .................... H04B 1/40
11,095,269 B2 * 8/2021 Komatsu ............ H03H 9/02228
11,431,319 B2 * 8/2022 Goto .................. H03H 9/02842
11,509,281 B2 * 11/2022 Omura ............... H03H 9/02228
11,601,114 B2 * 3/2023 Ota ........................ H03H 9/643
11,863,161 B2 * 1/2024 Takahashi ................ H03H 9/25
12,081,190 B2 * 9/2024 Daimon ............... H03H 9/1092
12,107,568 B2 * 10/2024 Raihn ................ H03H 9/02228
12,294,353 B2 * 5/2025 Konaka ................ H03H 9/6483
12,355,421 B2 * 7/2025 Maeda ............... H03H 9/02559
12,413,203 B2 * 9/2025 Kimura .................. H03H 9/568
12,418,273 B2 * 9/2025 Reinhardt .......... H03H 9/02228
12,431,863 B2 * 9/2025 Kimura .............. H03H 9/14541
12,483,221 B2 * 11/2025 Goto .................... H03H 9/6483
12,567,853 B2 * 3/2026 Taguchi ............. H03H 9/02574
12,574,012 B2 * 3/2026 Nakamura ............. H03H 9/133
2004/0119561 A1 * 6/2004 Omote .................. H03H 9/605
333/195
2009/0289741 A1 * 11/2009 Ito .......................... H03H 9/725
333/133
2012/0126913 A1 * 5/2012 Hara ...................... H03H 9/706
333/133
2016/0336919 A1 * 11/2016 Taniguchi .......... H03H 9/02559
2017/0163242 A1 * 6/2017 Miyamoto ............. H03H 9/542
2017/0201228 A1 * 7/2017 Kuzushita ................ H03H 9/13
2017/0353173 A1 * 12/2017 Sakurai .................. H03H 9/059
2018/0115300 A1 * 4/2018 Kaneko .................... H03H 9/25
2018/0131348 A1 * 5/2018 Takahashi ............ H03H 9/1457
2018/0159508 A1 * 6/2018 Irieda ...................... H03H 9/587
2019/0190491 A1 * 6/2019 Nosaka .............. H03H 9/14541
2019/0190493 A1 * 6/2019 Nosaka ................ H03H 9/6483
2019/0190496 A1 * 6/2019 Nosaka .............. H03H 9/14541
2019/0260351 A1 * 8/2019 Itou ...................... H03H 9/0566
2019/0305746 A1 * 10/2019 Ota .......................... H03H 9/64
2019/0312568 A1 * 10/2019 Isaka ...................... H03H 9/605
2019/0386642 A1 * 12/2019 Komatsu ............ H03H 9/02228
2020/0007110 A1 * 1/2020 Konaka .................. H03H 9/725
2020/0220518 A1 * 7/2020 Omura .................. H03H 9/132
2020/0220522 A1 * 7/2020 Nosaka .................. H03H 9/605
2020/0244246 A1 * 7/2020 Numata ................. H03H 9/145
2021/0058060 A1 * 2/2021 Goto .................... H03H 9/6483
2021/0111697 A1 * 4/2021 Daimon ............. H03H 9/02574
2021/0203306 A1 * 7/2021 Takahashi ............ H03H 9/6483
2022/0116017 A1 * 4/2022 Yamazaki ............ H03H 9/1071
2022/0123727 A1 * 4/2022 Reinhardt .......... H03H 9/02228
2023/0016884 A1 * 1/2023 Goto ........................ H03H 3/08
2023/0055758 A1 * 2/2023 Goto .................. H03H 9/02574
2023/0216481 A1 * 7/2023 Sung ...................... H03H 9/132
310/365
2023/0275562 A1 * 8/2023 Kimura .................. H03H 9/175
2023/0283259 A1 * 9/2023 Kimura .............. H03H 9/02228
333/24 R
2023/0336158 A1 * 10/2023 Konaka .............. H03H 9/02574
2023/0412143 A1 * 12/2023 Taguchi ............. H03H 9/02574
2024/0014799 A1 * 1/2024 Nakao .................... H03H 9/605
2024/0072759 A1 * 2/2024 Maeda ................. H03H 9/0576
2024/0243728 A1 * 7/2024 Okada ................ H03H 9/02637
2024/0429894 A1 * 12/2024 Raihn ................ H03H 9/02228
2025/0030400 A1 * 1/2025 Yabu .................... H03H 9/6483
2025/0030403 A1 * 1/2025 Nakamura ............. H03H 9/133
2025/0096771 A1 * 3/2025 Takata ................... H03H 9/145
2025/0183869 A1 * 6/2025 Kanazawa ........... H03H 9/6483
2025/0260388 A1 * 8/2025 Daimon ................. H03H 9/176
2025/0300626 A1 * 9/2025 Kasamatsu .............. H03H 9/25
2025/0337390 A1 * 10/2025 Isaka ................. H03H 9/14541
2026/0095146 A1 * 4/2026 Kimbara .................. H03H 9/08

* cited by examiner

ACOUSTIC WAVE DEVICE AND MODULE INCLUDING THE SAME

CROSS-REFERENCE TO RELATED APPLICATION

This application claims priority to Japanese Invention Patent Application No. 2022-101461, filed on Jun. 23, 2022, which is incorporated herein by reference in its entirety.

FIELD

The disclosure relates to an acoustic wave device, and more particularly to an acoustic wave device using a shear horizontal wave (SH wave), such as a filer, a duplexer, or a multiplexer.

BACKGROUND

In a high frequency communication system of a mobile communication terminal such as a smart phone, a device, such as a high frequency filter, is used for filtering out undesired signals other than communication frequencies.

In the device for filtering out the undesired signals, an acoustic wave device using a surface acoustic wave (SAW) element is frequently used. The SAW element includes an interdigital transducer (IDT) having a pair of comb-shaped electrodes formed on a piezoelectric substrate.

In some embodiments, the acoustic wave device may be made by a manufacturing method as follows. First, a multi-layered substrate is made by bonding a piezoelectric substrate that propagates an acoustic wave to a supporting substrate that has a thermal expansion coefficient smaller than that of the piezoelectric substrate. Then, the comb-shaped electrodes of the IDT are formed on the multi-layered substrate using photolithography. Next, the multi-layered substrate formed with the IDT is diced to have a predetermined size. In this manufacturing method, through formation of the multi-layered substrate, great change in temperature of the piezoelectric substrate may be suppressed by the supporting substrate, and frequency characteristics of the acoustic wave device as formed may be stabilized.

In some embodiments, Japanese Laid-Open Patent Application No. 2006-74202 discloses an improvement in power durability of the acoustic wave device through formation of a plurality of series-divided resonators.

However, for the acoustic wave device having more than three series-divided resonators, the closer the series-divided resonator is to the center of the acoustic wave device, the smaller a chance that a heat dissipation path is available. Therefore, the power durability of the acoustic wave device is not sufficiently improved.

SUMMARY

Therefore, an object of the disclosure is to provide an acoustic wave device that can alleviate at least one of the drawbacks of the prior art.

According to one aspect of the disclosure, the acoustic wave device includes a piezoelectric layer having a main surface, a plurality of series resonators formed on the main surface of the piezoelectric layer, and a plurality of parallel resonators formed on the main surface of the piezoelectric layer.

The series resonators include a first series resonator and a second series resonator. The first series resonator at least includes a first series-divided resonator, a second series-divided resonator, and a third series-divided resonator. The second series resonator at least includes a fourth series-divided resonator, a fifth series-divided resonator, and a sixth series-divided resonator.

One of the first, second, and third series-divided resonators which is disposed at a position where an electric signal is input first, has a first anti-resonance frequency; the others of the first, second, and third series-divided resonator have a second anti-resonance frequency.

One of the fourth, fifth, and sixth series-divided resonators which is centrally disposed has the second anti-resonance frequency; the others of the fourth, fifth, and sixth series-divided resonators have the first anti-resonance frequency.

According to another aspect of the disclosure, an acoustic wave device includes a piezoelectric layer having a main surface, a plurality of series resonators formed on the main surface of the piezoelectric layer, and a plurality of parallel resonators formed on the main surface of the piezoelectric layer.

The series resonators include a first series resonator and a second series resonator, and each of the first and second series resonators includes a plurality of series-divided resonators.

One of the series-divided resonators of the first series resonator which is disposed at a position where an electric signal is input first, has an anti-resonance frequency defined as a first anti-resonance frequency.

One of the series-divided resonators of the second series resonator which is centrally disposed, has an anti-resonance frequency defined as a second anti-resonance frequency, and the first anti-resonance frequency is lower than the second anti-resonance frequency.

According to yet another aspect of the disclosure, an acoustic wave device includes a piezoelectric layer having a main surface, a plurality of series resonators formed on the main surface of the piezoelectric layer, and a plurality of parallel resonators formed on the main surface of the piezoelectric layer.

Each of the series resonators and the parallel resonators includes an interdigital transducer having an interdigital transducer electrode that has a plurality of electrode fingers. The series resonators include a first series resonator and a second series resonator. Each of the first series resonator and the second series resonator has a plurality of series-divided resonators. The electrode fingers of the one of series-divided resonators of the first series resonator which is disposed at a position where an electric signal is input first is greater in number than the electrode fingers of the one of the series-divided resonators of the second series resonator which is centrally disposed.

According to yet another aspect of the disclosure, a module includes any one of the abovementioned acoustic wave devices.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
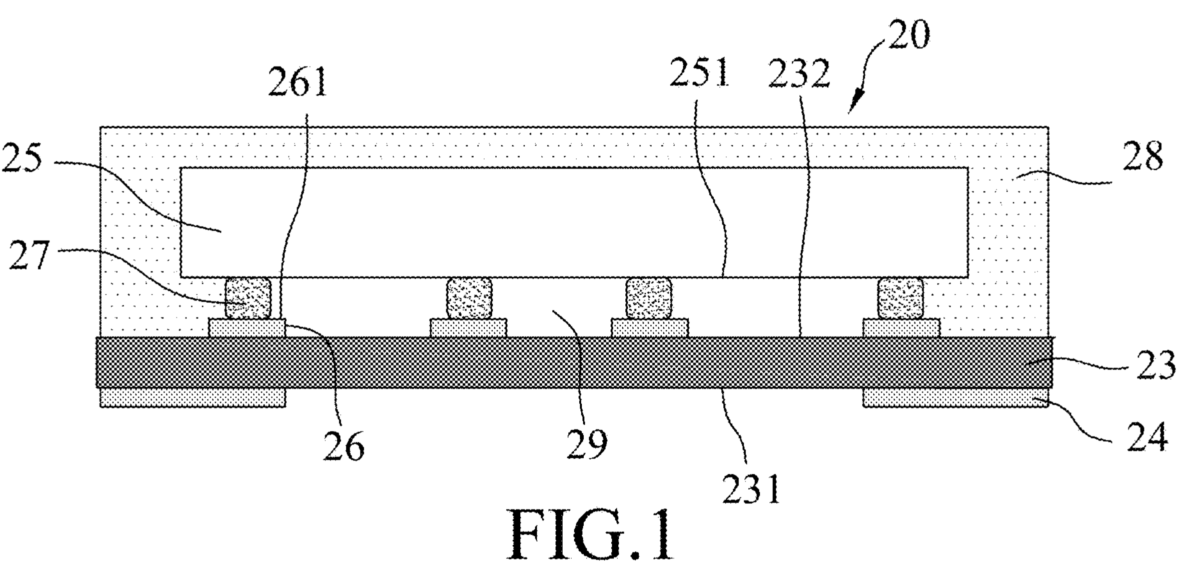
FIG. 1 is a sectional view illustrating an acoustic wave device of a first embodiment according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an acoustic wave device 20 of a first embodiment is illustrated by a sectional view. The acoustic wave device 20 includes a wiring board 23, a plurality of external connection terminals 24, a device chip 25, a plurality of electrode pads 26, a plurality of bumps 27, and an encapsulant element 28.

The wiring board 23 may be a multi-layered substrate made of resin. In an alternative embodiment, the wiring board 23 may be a multi-layered substrate made of low temperature co-fired ceramics (LTCC), which is composed of a plurality of dielectric layers.

The external connection terminals 24 are separately formed on a lower surface 231 of the wiring board 23.

The electrode pads 26 are separately formed on an upper surface 232 of the wiring board 23 that is opposite to the lower surface 231. The electrode pads 26 may be made of a metal such as copper or an alloy, for example, a copper-containing alloy. In addition, the electrode pads 26 may have a thickness ranging from 10 μm to 20 μm.

The bumps 27 are respectively formed on top surfaces 261 of the electrode pads 26 that face away from the upper surface 232 of the wiring board 23. The bumps 27 may be made of gold. In addition, the bumps 27 may have a thickness ranging from 10 μm to 50 μm.

The wiring board 23 and the device chip 25 cooperatively define a gap 29 therebetween.

The device chip 25 is mounted on the upper surface 232 of the wiring board 23 via the bumps 27 and the electrode pads 26, and is electrically connected to the electrode pads 26 via the bumps 27.

The device chip 25 (also referred to as a piezoelectric layer) may include a piezoelectric substrate that may be made of a piezoelectric single crystal such as lithium tantalite, lithium niobate or quartz, and that may have a thickness ranging from 0.3 μm to 5 μm. In an alternative embodiment, the piezoelectric substrate may be made of piezoelectric ceramics.

In some embodiments, the device chip 25 (the piezoelectric layer) may include a multi-layered substrate that is formed by bonding a supporting substrate to the piezoelectric substrate. The supporting substrate has a thermal expansion coefficient smaller than that of the piezoelectric substrate. The support substrate may be made of sapphire, silicon, alumina, spinel, crystal, or glass. The piezoelectric substrate and the support substrate may be bonded by Van der Waals force.

In this embodiment, the device chip 25 (the piezoelectric layer) is the multi-layered substrate, and has a main surface 251 defined by the piezoelectric substrate and connected to the bumps 27. The main surface 251 is formed with SAW elements 52 so as to form a transmission filter 30 (see FIG. 3) or a receiving filter. In some embodiments, the main surface 251 is formed with a duplexer including at least one transmission filter 30 and at least one reception filter.

The transmission filter 30 is formed to allow an electrical signal in a desired frequency band to pass therethrough. In some embodiments, the transmission filter 30 is a ladder-type filter including a plurality of series resonators and a plurality of parallel resonators.

The reception filter is formed to allow an electrical signal in a desired frequency band to pass therethrough. In some embodiments, the reception filter is a ladder-type filter.

The encapsulant element 28 covers the device chip 25. In some embodiments, the encapsulant element 28 may be made of an insulating material such as synthetic resin. In some embodiments, the encapsulant element 28 may be made of a metal.

In a case where the encapsulant element 28 is made of the synthetic resin, the synthetic resin may be an epoxy resin, polyimide, or the like. In some embodiments, the encapsulant element 28 may be formed by a low temperature hardening process using the epoxy resin.

Figure 2:
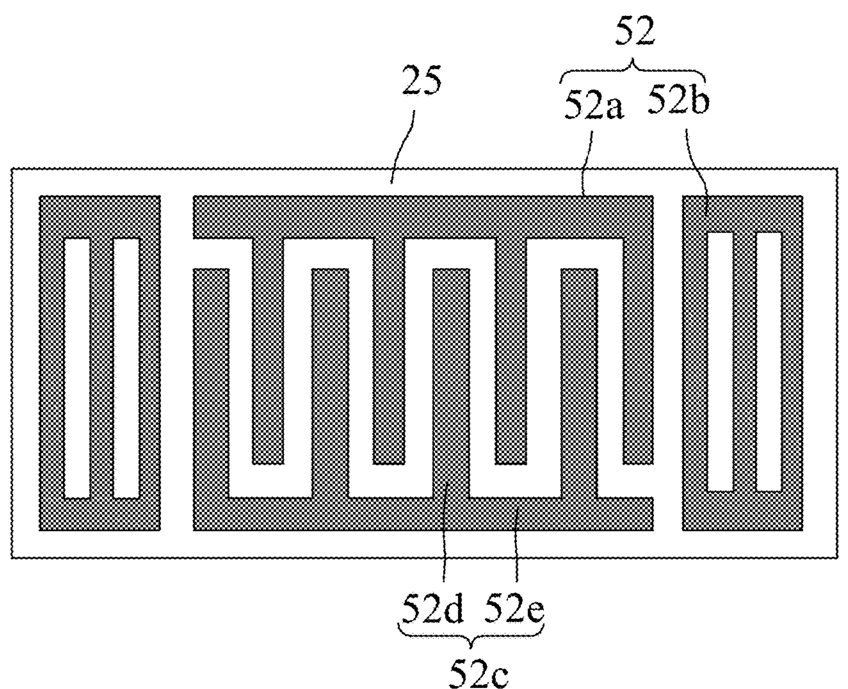
FIG. 2 is a schematic view illustrating SAW elements of the acoustic wave device of the first embodiment.

Next, referring to FIG. 2, the SAW elements 52 are formed on the main surface 251 of the device chip 25. As shown in FIG. 2, the interdigital transducer (IDT) including the IDT electrode **52*a* and a pair of reflectors 52*b* formed on the main surface 251 of the device chip 25 are shown as an example for illustrating the SAW elements 52. The IDT electrode 52*a* and the reflectors 52*b*** are provided to excite the acoustic waves, mainly the SH waves.

In some embodiments, the IDT electrode **52*a* and the reflectors 52*b* may be made of an alloy of aluminum and copper. In some embodiments, the IDT electrode 52*a* and the reflectors 52*b*** may be made of a metallic material selected from the group consisting of aluminum, molybdenum, iridium, tungsten, cobalt, nickel, ruthenium, chromium, strontium, titanium, palladium, silver and alloys thereof.

In some embodiments, the IDT electrode **52*a* and the reflectors 52*b* may be formed of a laminated metal film wherein a plurality of metal layers are laminated. In some embodiments, the thickness of the IDT electrode 52*a* and/or the reflectors 52*b*** ranges from 150 nm to 450 nm.

The IDT electrode **52*a* has a pair of comb-shaped electrodes 52*c*. The comb-shaped electrodes 52*c* are opposite to each other. Each of the comb-shaped electrodes 52*c* has a plurality of longitudinally extending electrode fingers 52*d* and a bus bar 52*e* connected to the electrode fingers 52*d***.

One of the reflectors **52*b* is adjacent to one side of the IDT electrode 52*a*. The other of the reflectors 52*b* is adjacent to the other side of the IDT electrode 52*a***.

Figure 3:
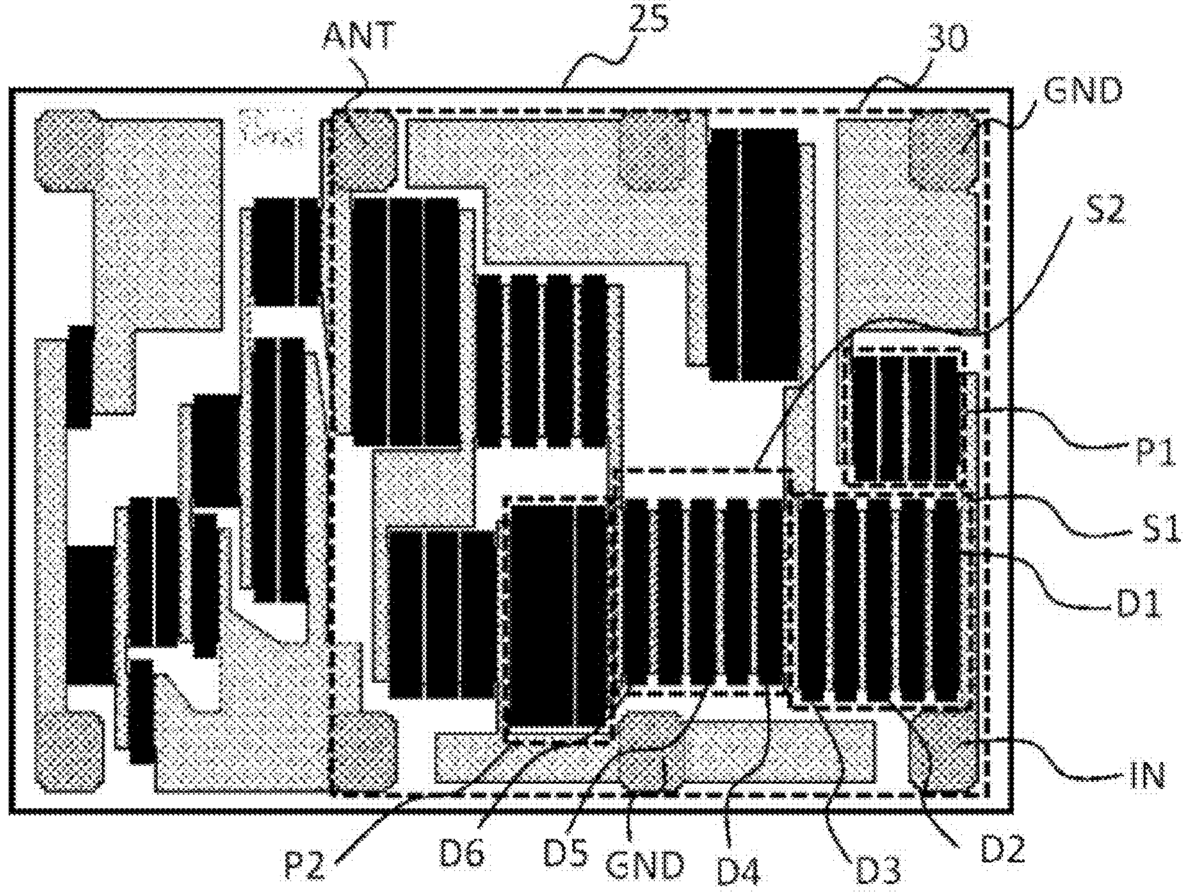
FIG. 3 is a schematic view illustrating the acoustic wave device of the first embodiment.

Referring to FIG. 3, the transmission filter 30 formed on the device chip 25 of the acoustic wave device 20 of the first embodiment is illustrated. As shown in FIG. 3, the ladder-type transmission filter 30 formed on the device chip is a band pass filter. The transmission filter 30 includes a first series resonator (S1), a second series resonator (S2), a first parallel resonator (P1), a second parallel resonator (P2), an input pad (IN), an antenna pad (ANT), and a ground pad (GND). The supporting substrate is provided on a subsidiary surface of the piezoelectric substrate opposite to the main surface 251 on which the first and second series resonators (S1, S2) and the first and second parallel resonators (P1, P2) are formed.

The first series resonator (S1) includes a plurality of series-divided resonators having a first series-divided resonator (D1), a second series-divided resonator (D2), and a third series-divided resonator (D3). The second series resonator (S2) includes a plurality of series-divided resonators having a fourth series-divided resonator (D4), a fifth series-divided resonator (D5), and a sixth series-divided resonator (D6).

Each of the first series-divided resonator (D1), the second series-divided resonator (D2), the third series-divided resonator (D3), the fourth series-divided resonator (D4), the fifth series-divided resonator (D5), and the sixth series-divided resonator (D6) may respectively include the IDT electrode 52*a*.

In one embodiment, the first series-divided resonator (D1), the second series-divided resonator (D2), the third series-divided resonator (D3), the fourth series-divided resonator (D4), the fifth series-divided resonator (D5), and the sixth series-divided resonator (D6) respectively have 328, 314, 314, 328 314, 328 electrode fingers 52*d*.

In an area of the main surface 251 of the device chip 25 for forming the series-divided resonators of the first series resonator (S1), the first series-divided resonator (D1) is disposed at a position where an electric signal is first input when the electric signal is input from the input pad (IN). The anti-resonance frequency of the first series-divided resonator (D1) may be, for example, 2638 MHz in Band 7 of the transmission filter 30.

In the area of the main surface 251 of the device chip 25 for formation of the series-divided resonators of the first series resonator (S1), the second series-divided resonator (D2) and the third series-divided resonator (D3) are disposed at the positions other than the position where the first series-divided resonator (D1) is disposed. The anti-resonance frequency of the second series-divided resonator (D2) and the third series-divided resonator (D3) may be, for example, 2645 MHz in Band 7 of the transmission filter 30.

In an area of the main surface 251 of the device chip 25 for forming the series-divided resonators of the second series resonator (S2), the fifth series-divided resonator (D5) is disposed at the center of the transmission filter 30. The anti-resonance frequency of the fifth series-divided resonator (D5) may be, for example, 2645 MHz in Band 7 of the transmission filter 30.

In the area of the main surface 251 of the device chip 25 for formation the series-divided resonators of the second series resonator (S2), the fourth series-divided resonator (D4) and the sixth series-divided resonator (D6) are disposed at the positions other than the position where the fifth series-divided resonator (D5) is disposed. The anti-resonance frequency of the fourth series-divided resonator (D4) and the sixth series-divided resonator (D6) may be, for example, 2638 MHz in Band 7 of the transmission filter 30.

The input pad (IN), the antenna pad (ANT), and the ground pad (GND) are respectively disposed on the bumps 27, and are electrically connected to the electrode pads 26 formed on the wiring board 23.

The series-divided resonators of the first and second series resonators (S1, S2) are input with the electric signal and emit heat due to excitation. Once heat dissipation is inefficient, the series-divided resonators are easily damaged as the series-divided resonators are in a state of high temperature for too long. The series-divided resonators primarily dissipate heat from the bumps 27 through wiring formed on the wiring board 23.

In this embodiment, a distance between the first series resonator (S1) and the input pad (IN) is smaller than a distance between the second series resonator (S2) and the input pad (IN). Besides, a distance between the first series resonator (S1) and the bumps 27 formed on the input pad (IN) is smaller than a distance between the second series resonator (S2) and the bump 27 formed on the input pad (IN). Therefore, the first series resonator (S1) dissipates heat more easily than the second series resonator (S2). In other words, the second series resonator (S2) is more difficult to dissipate heat than the first series resonator (S1), and requires higher power durability in view of heat dissipation.

In the series-divided resonators of the second series resonator (S2), since the fifth series-divided resonator (D5) is provided at the center of the transmission filter 30, the fourth series-divided resonator (D4) and the sixth series-divided resonator (D6) are also excited to emit heat when the fifth series-divided resonator (D5) is excited to emit heat. The fifth series-divided resonator (D5) is sandwiched between two heat-generating bodies, i.e., the fourth series-divided resonator (D4) and the sixth series-divided resonator (D6), and an amount of heat that may be dissipated through a heat dissipation path is smaller than that of the fourth series-divided resonator (D4) and the sixth series-divided resonator (D6).

Therefore, in the series-divided resonators of the second series resonator (S2), the fifth series-divided resonator (D5) disposed at the center of the transmission filter 30 requires higher power durability in view of heat dissipation.

In the series-divided resonators of the first series resonator (S1), the first series-divided resonator (D1), which is disposed at a position where the electric signal to the input pad (IN) is input first, easily dissipates heat due to its location being closest to the bump 27.

The pass band of the Band 7 of the transmission filter 30 may be 2500 MHz to 2570 MHz. The anti-resonance frequency of the first series-divided resonator (D1), the fourth series-divided resonator (D4), and the sixth series-divided resonator (D6) is 2638 MHz (hereinafter referred to the first anti-resonance frequency), and the anti-resonance frequency of the second series-divided resonator (D2), the third series-divided resonator (D3), and the fifth series-divided resonator (D5) is 2645 MHz (hereinafter referred to as the second anti-resonance frequency). The plurality of series resonators and the plurality of parallel resonators constitute a band-pass filter, and the first anti-resonance frequency and the second anti-resonance frequency are higher than the highest frequency of the pass band of the band-pass filter. The first anti-resonance frequency is lower than the second anti-resonance frequency.

In this embodiment, the anti-resonance frequency of the series resonators of the ladder-type filter is higher than the highest frequency 2570 MHz (the system frequency) in the pass band, and heat is generated more easily as the frequency is closer to 2570 MHz. Therefore, in the series-divided resonators of the second series resonator (S2), the anti-resonance frequency of the fifth series-divided resonator (D5), whose power durability needs to be most improved, is 2645 MHz, and in the series-divided resonators of the first series resonator (S1), the anti-resonance frequency of the first series-divided resonator (D1), which exhibits the most efficient heat dissipation, is 2638 MHz.

Figure 4:
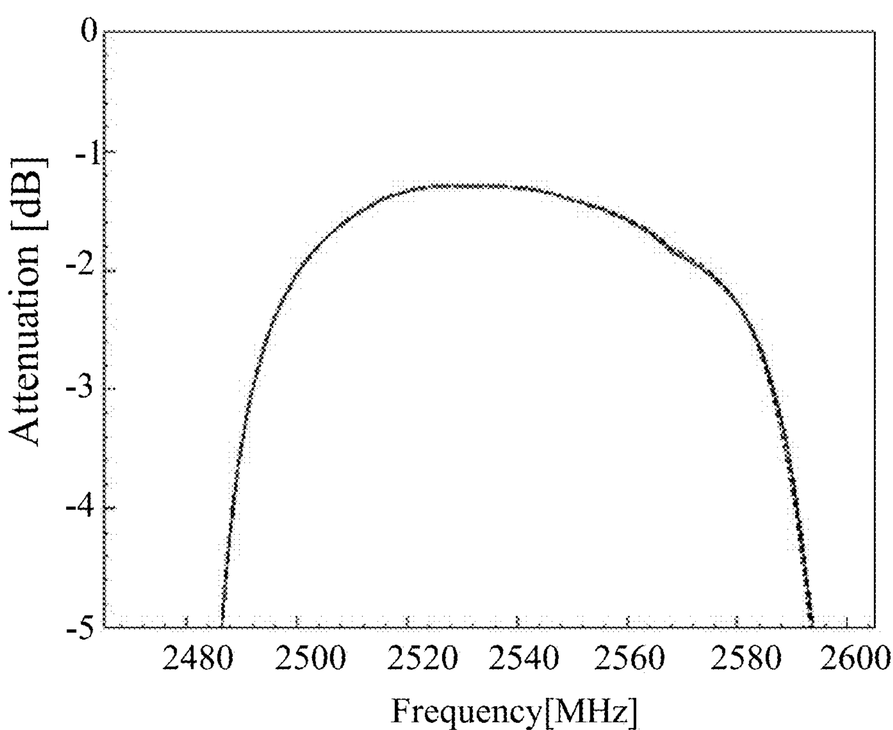
FIG. 4 is a schematic view illustrating a comparison in passing characteristics between a transmission filter of the acoustic wave device of the first embodiment and a transmission filter of an acoustic wave device of a comparative example.

FIG. 4 is a schematic view illustrating a comparison in passing characteristics between the transmission filter 30 of the acoustic wave device 20 of the first embodiment and a transmission filter of an acoustic wave device of a comparative example. The solid line shows the passing characteristic of the transmission filter 30 of the acoustic wave device 20 of the first embodiment. The broken line shows the passing characteristic of the transmission filter of the acoustic wave device of the comparative example.

In the transmission filter of the acoustic wave device of the comparative example, the anti-resonance frequency of a fifth series-divided resonator is 2638 MHz, and the anti-resonance frequency of a first series-divided resonator of the is 2645 MHz. The other structures of the acoustic wave device are the same as those of the acoustic wave device of the first embodiment.

As shown in FIG. 4, the acoustic wave device of the first embodiment is almost no different in terms of the passing characteristics from the acoustic wave device of the comparative example. In other words, the structural arrangement of the acoustic wave device of the disclosure may not adversely affect the passing characteristics of the acoustic wave device.

Figure 5:
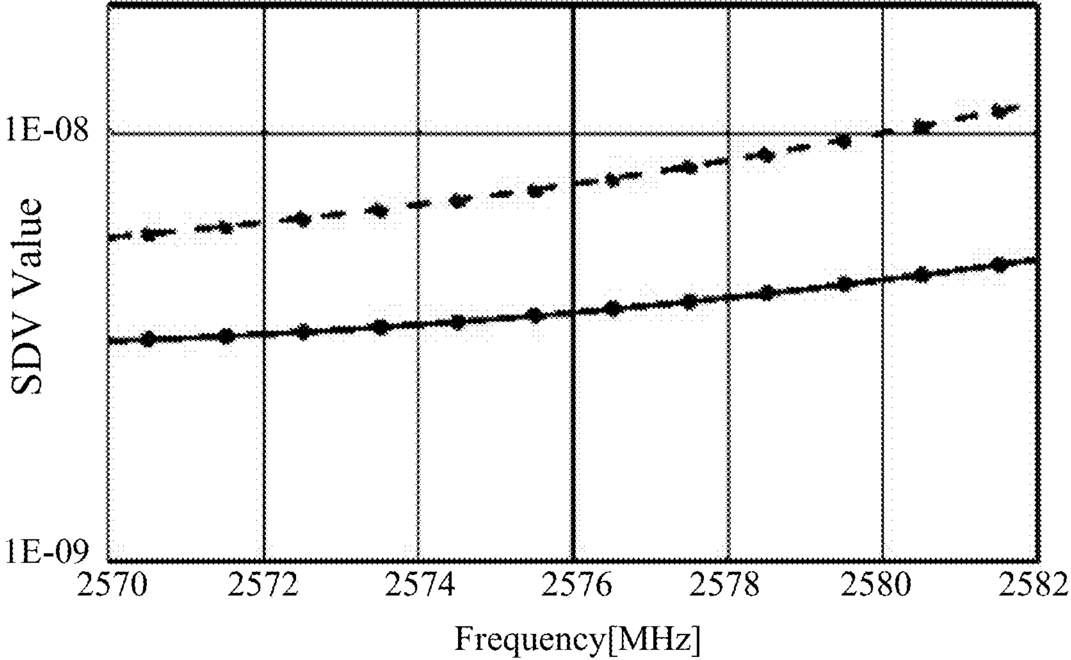
FIG. 5 is a schematic view illustrating a comparison in power durability between the transmission filter of the acoustic wave device of the first embodiment and the transmission filter of the acoustic wave device of the comparative example.

FIG. 5 is a schematic view illustrating a comparison in power durability between the fifth series-divided resonator (D5) of the transmission filter of the acoustic wave device of the first embodiment and the fifth series-divided resonator of the transmission filter of the acoustic wave device of the comparative example. The solid line shows the power durability of fifth series-divided resonator (D5) of the first embodiment. The broken line shows the power durability of the fifth series-divided resonator of the comparative example.

The power durability is compared with a surface acoustic wave power durability value (SDV value), which is a value obtained by dividing the product of the power consumption and the displacement amount of the electrode fingers by the area of the resonator. The SDV value is also called an SAW dual value, which represents a load per unit area of a resonator, and the lower the value the higher the power durability.

As shown in FIG. 5, the SDV value of the fifth series-divided resonator (D5) of the transmission filter of the acoustic wave device of the first embodiment is observed to be significantly lower than that of the comparative example.

Figure 6:
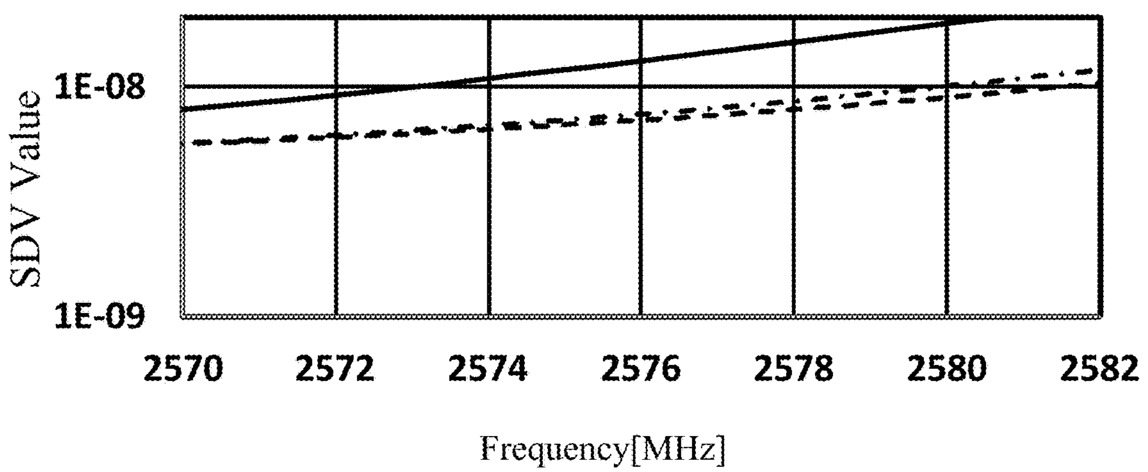
FIG. 6 is a schematic view illustrating a comparison in power durability between among the transmission filter of the acoustic wave device, a variation of the first embodiment, and the transmission filter of the acoustic wave device of the comparative example.

FIG. 6 is a schematic view illustrating a comparison in power durability among the first series-divided resonator (D1), a variation of the transmission filter 30 of the acoustic wave device 20 of the first embodiment, and the first series-divided resonator of the transmission filter of the acoustic wave device of the comparative example. The solid line shows the power durability of the first series-divided resonator (D1) of the first embodiment. The broken line shows the power durability of the first series-divided resonator of the comparative example. The dash-dot line shows the power durability of the variation of the first series-divided resonator of the first embodiment. The number of electrode fingers of the variation of the first series-divided resonator is 400, which is greater than the number of the electrode fingers **52*d*** of the fifth series-divided resonator (D5).

As shown in FIG. 6, as compared with the fifth series-divided resonator of the transmission filter of the acoustic wave device of the comparative example, the first series-divided resonator (D1) of the transmission filter 30 of the acoustic wave device 20 of the first embodiment is increased in the SDV value and is decreased in the power durability. On the other hand, the variation of the first series-divided resonator has improved power durability as compared with the first embodiment.

Figure 7:
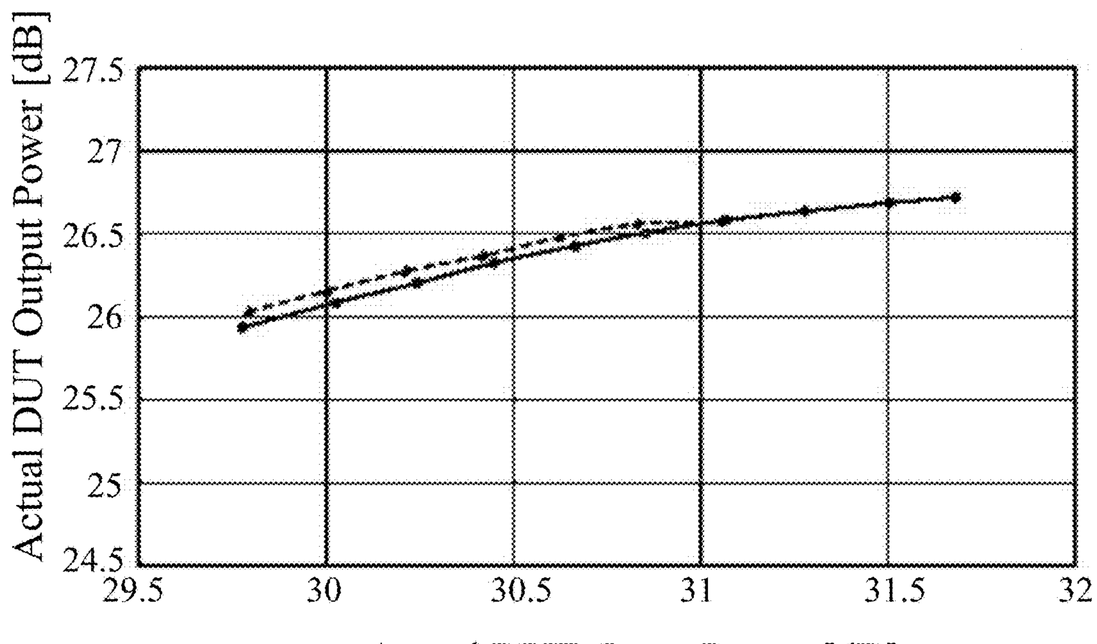
FIG. 7 is a schematic view illustrating a comparison in power durability between the variation of the transmission filter of the acoustic wave device of the first embodiment and the transmission filter of the acoustic wave device of the comparative example.

FIG. 7 is a schematic view illustrating a comparison in test results of power durability between the transmission filter 30 of the acoustic wave device 20 of the first embodiment having the variation of the first series-divided resonator and the transmission filter of the acoustic wave device of the comparative example. The solid line shows the power durability of the transmission filter 30 of the acoustic wave device 20 of the first embodiment having the variation of the first series-divided resonator. The broken line shows the power durability of the transmission filter of the comparative example.

A power durability test is conducted by first preparing the transmission filter 30 of the acoustic wave device 20 of the first embodiment using the variation of the first series-divided resonator and the transmission filter of the acoustic wave device of the comparative example, then by increasing the input power gradually until the transmission filter 30 of the first embodiment and the transmission filter of the comparative example are fused, and finally respectively recording the input power at the time of fusing.

As shown in FIG. 7, the transmission filter 30 of the acoustic wave device according to the first embodiment using the variation of the first series-divided resonator of the first embodiment is observed to have significantly improved power durability as compared with the comparative example.

According to the first embodiment, the acoustic wave device with increased power durability may be provided.

Figure 8:
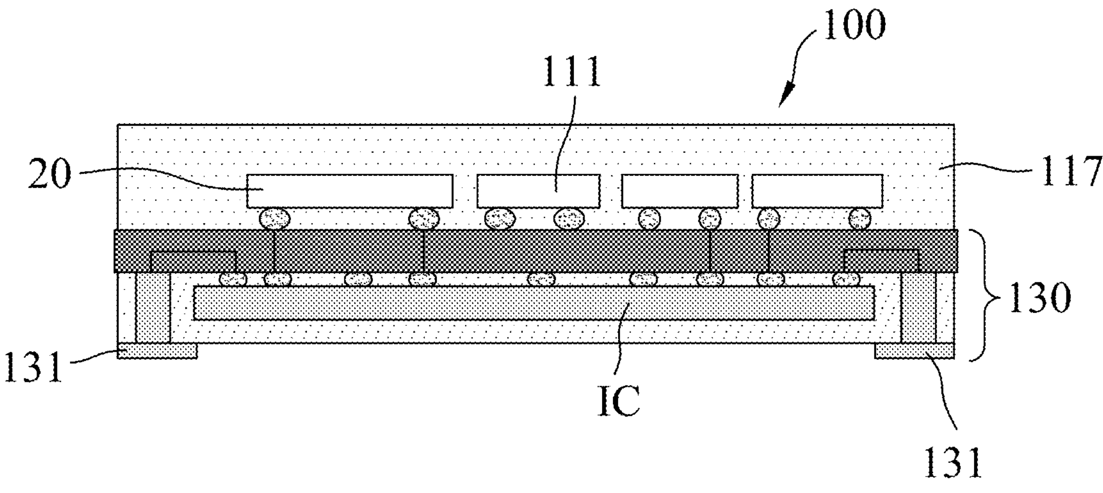
FIG. 8 is a sectional view illustrating a module including the acoustic wave device of a second embodiment according to the disclosure.

FIG. 8 is a sectional view illustrating of a module including the acoustic wave device of the first embodiment according to the disclosure. It should be understood that the same or equivalent parts as those of the first embodiment are given the same reference numerals. The same or equivalent portions will be omitted from the description.

As shown in FIG. 8, a module 100 includes a wiring board 130, a plurality of external connection terminals 131, an integrated circuit module (IC), the acoustic wave device 20, an inductor 111, and a sealing element 117.

The external connection terminals 131 are formed on a lower surface of the wiring board 130. The external connection terminals 131 are mounted on a main board of a predetermined mobile communication terminal.

In some embodiments, the integrated circuit module (IC) is mounted on the wiring board 130. The integrated circuit assembly IC includes a switch circuit and a low noise amplifier.

The acoustic wave device 20 is mounted on the main surface of the wiring board 130 that is opposite to the lower surface.

The inductor 111 is mounted on the main surface of the wiring board 130. The inductor 111 is provided for impedance matching. In some embodiments, the inductor 111 may be an Integrated Passive Device (IPD).

The sealing element 117 seals a plurality of electronic components including the acoustic wave device 20.

According to the second embodiment described above, the module 100 includes the acoustic wave device 20. Therefore, the module 100 including the acoustic wave device 20 with increased power durability may be provided.

The phraseology and terminology used in the present disclosure are for the purpose of description and should not be regarded as limiting. The use of "including," "comprising," "having," or variations thereof herein means the inclusion of the items listed hereinafter and equivalents thereof, as well as additional items.

The reference to "or" may be construed so that any term described using "or" may be indicative of one, more than one, or all of the terms of that description.

References to front, back, left, right, top, bottom, and side are intended for convenience of description. Such references are not intended to limit the components of the present disclosure to any one positional or spatial orientation. Accordingly, the foregoing description and drawings are by way of example only.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An acoustic wave device, comprising:

a piezoelectric layer having a main surface;

a plurality of series resonators formed on said main surface of said piezoelectric layer, said series resonators including a first series resonator and a second series resonator, said first series resonator at least including a first series-divided resonator, a second series-divided resonator, and a third series-divided resonator, said second series resonator at least including a fourth series-divided resonator, a fifth series-divided resonator, and a sixth series-divided resonator; and a plurality of parallel resonators formed on said main surface of said piezoelectric layer, wherein one of said first, second and third series-divided resonators which is disposed at a position where an electric signal is input first, has a first anti-resonance frequency, the others of said first, second and third series-divided resonators having a second anti-resonance frequency;

wherein one of said fourth, fifth and sixth series-divided resonators which is centrally disposed has said second anti-resonance frequency, the others of said fourth, fifth, and sixth series-divided resonators having said first anti-resonance frequency.

2. The acoustic wave device of claim 1, further comprising a wiring board and at least one bump disposed between said wiring board and said piezoelectric layer, a distance between said first series resonator and said at least one bump being smaller than that between said second series resonator and said at least one bump.

3. The acoustic wave device of claim 2, wherein said wiring board and said piezoelectric layer cooperatively define a gap therebetween.

4. The acoustic wave device of claim 1, wherein said series resonators and said parallel resonators form a band pass filter, said first anti-resonance frequency and said second anti-resonance frequency being higher than a highest frequency of a pass band of said band pass filter, said first anti-resonance frequency being lower than said second anti-resonance frequency.

5. The acoustic wave device of claim 1, wherein said pass band ranges from 2500 MHz to 2570 MHz.

6. The acoustic wave device of claim 5, wherein said interdigital transducer electrode is made of a metallic material selected from the group consisting of aluminum, molybdenum, iridium, tungsten, cobalt, nickel, ruthenium, chromium, strontium, titanium, palladium, silver and alloys thereof.

7. The acoustic wave device of claim 5, wherein said interdigital transducer further includes a pair of reflectors, said interdigital transducer electrode and/or said reflectors having a thickness ranging from 150 nm to 450 nm.

8. The acoustic wave device of claim 1, wherein each of said series resonators and said parallel resonators includes an interdigital transducer having an interdigital transducer electrode having a plurality of electrode fingers, said electrode fingers of said one of said first, second and third series-divided resonator which is disposed at the position where the electric signal is input first being greater in number than said electrode fingers of said one of said fourth, fifth and sixth series-divided resonators which is centrally disposed.

9. The acoustic wave device of claim 1, wherein said piezoelectric layer is made of a single crystal of lithium niobate, lithium tantalite or piezoelectric ceramics.

10. The acoustic wave device of claim 1, wherein said piezoelectric layer has a subsidiary surface opposite to said main surface, said acoustic wave device further comprising a supporting substrate disposed on said subsidiary surface of said piezoelectric layer.

11. The acoustic wave device of claim 10, wherein said supporting substrate is made of sapphire, silicon, alumina, spinel, crystal, or glass.

12. The acoustic wave device of claim 1, wherein said piezoelectric layer and said supporting substrate are bonded by Van der Waals force.

13. The acoustic wave device of claim 1, wherein said piezoelectric layer has a thickness ranging from 0.3 μm to 5 μm.

14. A module comprising an acoustic wave device as claimed in claim 1.

15. An acoustic wave device, comprising:

a piezoelectric layer having a main surface;

a plurality of series resonators formed on said main surface of said piezoelectric layer; and a plurality of parallel resonators formed on said main surface of said piezoelectric layer, wherein said series resonators include a first series resonator and a second series resonator, each of said first and second series resonators including a plurality of series-divided resonators;

wherein one of said series-divided resonators of said first series resonator which is disposed at a position where an electric signal is input first, has a first anti-resonance frequency; and wherein one of said series-divided resonators of said second series resonator which is centrally disposed has a second anti-resonance frequency, said first anti-resonance frequency being lower than said second anti-resonance frequency.

16. The acoustic wave device of claim 15, further comprising an input pad disposed on said piezoelectric layer, a distance between said first series resonator and said input pad being smaller than that between said second series resonator and said input pad.

17. The acoustic wave device of claim 15, wherein said series resonators and said parallel resonators form a band pass filter, said first anti-resonance frequency and said second anti-resonance frequency being higher than a highest frequency of a pass band of said band pass filter.

18. An acoustic wave device, comprising:

a piezoelectric layer having a main surface;

a plurality of series resonators formed on said main surface of said piezoelectric layer; and a plurality of parallel resonators formed on said main surface of said piezoelectric layer, wherein each of said series resonators and said parallel resonators includes an interdigital transducer having an interdigital transducer electrode having a plurality of electrode fingers, said series resonators including a first series resonator and a second series resonator, each of said first series resonator and said second series resonator having a plurality of series-divided resonators, said electrode fingers of said one of series-divided resonators of said first series resonator which is disposed at a position where an electric signal is input first being greater in number than said electrode fingers of said one of said series-divided resonators of said second series resonator which is centrally disposed.

19. The acoustic wave device of claim 18, wherein said electrode fingers of the others of said series-divided resonators of said first series resonator is smaller in number than said electrode fingers of said one of said series-divided resonators of said first series resonator disposed at the position where the electric signal is input first.

20. The acoustic wave device of claim 18, wherein said electrode fingers of the others of said series-divided resonators of said second series resonator is greater in number than said one of said series-divided resonators of said second series resonator which is centrally disposed.

* * * * *